(12) United States Patent
Engbrecht et al.

(10) Patent No.: US 7,338,893 B2
(45) Date of Patent: Mar. 4, 2008

(54) INTEGRATION OF PORE SEALING LINER INTO DUAL-DAMASCENE METHODS AND DEVICES

(75) Inventors: Edward Raymond Engbrecht, Austin, TX (US); Satyavolu Srinivas Papa Rao, Garland, TX (US); Sameer Kumar Ajmera, Richardson, TX (US); Stephan Grunow, Wappingers Falls, NY (US)

(73) Assignee: Texas Instruments Incorporated, Dallas, TX (US)

( * ) Notice: Subject to any disclaimer, the term of this patent is extended or adjusted under 35 U.S.C. 154(b) by 154 days.

(21) Appl. No.: 11/286,877

(22) Filed: Nov. 23, 2005

(65) Prior Publication Data

US 2007/0117371 A1    May 24, 2007

(51) Int. Cl.
*H01L 21/4763*    (2006.01)
(52) U.S. Cl. .................. 438/627; 438/653; 438/687
(58) Field of Classification Search ............... 438/618, 438/627, 643, 653, 672, 675, 687, 778; 257/751, 257/773, 774
See application file for complete search history.

(56) References Cited

U.S. PATENT DOCUMENTS

| 6,893,985 | B2 | 5/2005 | Goodner |
| 6,909,195 | B2 | 6/2005 | Li et al. |
| 6,917,108 | B2 | 7/2005 | Fitzsimmons et al. |
| 2004/0147117 | A1* | 7/2004 | Ngo et al. .................. 438/687 |
| 2005/0133920 | A1* | 6/2005 | Liou et al. .................. 257/758 |
| 2005/0239278 | A1* | 10/2005 | Li et al. ..................... 438/618 |
| 2006/0216932 | A1* | 9/2006 | Kumar et al. ............... 438/641 |
| 2006/0244152 | A1* | 11/2006 | Abell ........................ 257/775 |
| 2007/0004230 | A1* | 1/2007 | Johnston et al. ............ 438/785 |
| 2007/0007654 | A1* | 1/2007 | Man .......................... 257/751 |
| 2007/0080461 | A1* | 4/2007 | Lu et al. ..................... 257/758 |

OTHER PUBLICATIONS

U.S. Appl. No. 10/903,597, filed Jul. 29, 2004, Papa Rao et al., Entire Document.

* cited by examiner

*Primary Examiner*—Kevin M. Picardat
(74) *Attorney, Agent, or Firm*—W. James Brady, III; Frederick J. Telecky, Jr.

(57) ABSTRACT

A device employs damascene layers with a pore sealing liner and includes a semiconductor body. A metal interconnect layer comprising a metal interconnect is formed over the semiconductor body. A dielectric layer is formed over the metal interconnect layer. A conductive trench feature and a conductive via feature are formed in the dielectric layer. A pore sealing liner is formed only along sidewall of the conductive via feature and along sidewalls and bottom surfaces of the conductive trench feature. The pore sealing liner is not substantially present along a bottom surface of the conductive via feature.

14 Claims, 7 Drawing Sheets

INTEGRATION OF PORE SEALING LINER INTO DUAL-DAMASCENE METHODS AND DEVICES

FIELD OF INVENTION

The present invention relates generally to semiconductor devices and more particularly to integration of a pore sealing liner into dual damascene methods and devices.

BACKGROUND OF THE INVENTION

As the density of semiconductor devices increases, the demands on interconnect layers for connecting the semiconductor devices to each other also increases. Copper has increasingly become the metal of choice for fabricating interconnects in integrated circuits using a damascene process.

Interconnect layers continue to decrease in line width and are spaced closer together in order to attain increased density, faster performance, and lower cost. To further improve performance, dielectric materials having lower dielectric constants (also referred to as k-value) are employed in interconnect layers. However, lower k-values result in dielectric materials with higher porosity and lower density. As porosity increases, the internal pore-structure of the dielectric matrix can become more interconnected. This high porosity combined with interconnected pore volume can allow materials, in particular copper, to diffuse or penetrate through low k-value dielectric materials. Accordingly, defects and failure mechanisms can result, which can degrade performance reduce the operational lifetime of devices, and even lead to complete device failure. Another problem with porous low k-value dielectric materials due to the high porosity and low density of the materials is that they tend to have irregular or non-smooth sidewalls after features such as trenches or vias have been etched into or through them. As a consequence, subsequently formed and/or deposited materials form irregularly along sidewalls of the low k-value dielectric layers. Thus, for example, forming copper diffusion barrier layers with a uniform thickness along sidewalls of low k-value dielectric layers can be problematic due to the irregularities of the low k-value dielectric layer sidewalls.

What is needed are devices and methods that employ low k-value dielectric materials within copper based interconnect structures and also mitigate problems, such as those described above, that result from employing the low k-value dielectric materials.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention facilitates damascene processing and semiconductor devices by employing a pore sealing liner present on sidewalls and bottoms of trench regions, sidewalls of via regions, but not on bottom surfaces of via regions. As a result, low-k porous dielectric materials can be employed in damascene processing without other species, such as moisture, metal barrier precursors, copper, solvents, plasma chemistries, and the like, undesirably migrating into the low-k, porous dielectric matrix. Additionally, a low resistance contact from conductive via features to underlying structures is also provided. Sufficiently removing the pore sealing liner on the bottom surfaces of via regions permits low resistance electrical contact to underlying devices.

In accordance with an aspect of the present invention, a semiconductor device employs damascene layers with a pore sealing liner. A semiconductor body is present that can include one or more semiconductor devices and layers, such as transistor devices, diodes, capacitors, resistors, inductors, metal interconnect layers, and the like. A metal interconnect layer comprising a metal interconnect is formed over the semiconductor body. A dielectric layer is formed over the interconnect layer. The dielectric layer is subsequently processed by techniques such as photolithography, wet cleans, etches, and the like to form within the dielectric layer a via feature within a lower portion of the dielectric layer and a trench feature within an upper portion of the dielectric layer, wherein the via feature is placed to permit electrical contact with the metal interconnect underneath. A pore sealing liner is formed along sidewall surfaces of the via feature and along sidewall and bottom surfaces of the trench feature. This is followed by metal deposition, chemical mechanical planarization, and the like, to complete the formation of conductive via and trench features that are in electrical contact with the metal interconnect underneath. Other devices and methods are disclosed.

The following description and annexed drawings set forth in detail certain illustrative aspects and implementations of the invention. These are indicative of but a few of the various ways in which the principles of the invention may be employed.

DETAILED DESCRIPTION OF THE INVENTION

Figure 1A:
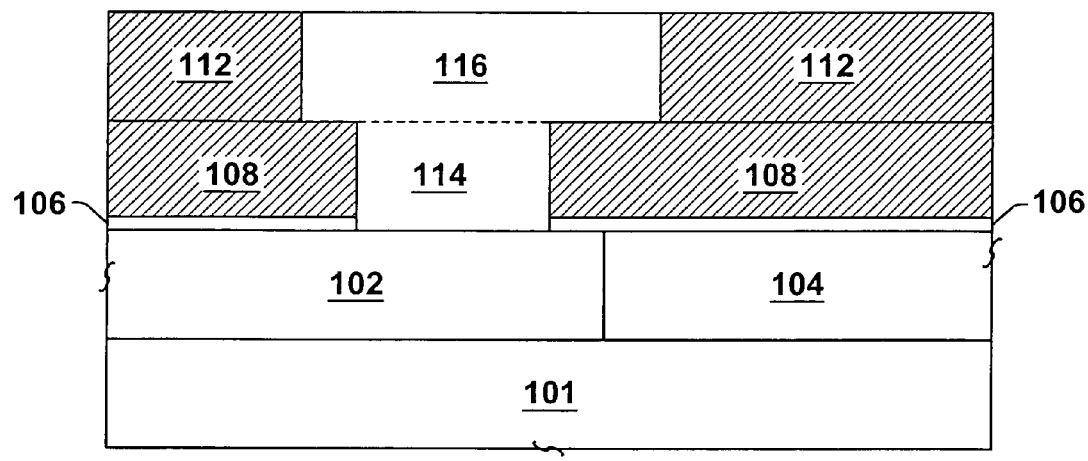
FIG. 1A is a cross sectional view of a semiconductor device fabricated with conventional damascene processes.

One or more implementations of the present invention will now be described with reference to the attached drawings, wherein like reference numerals are used to refer to like elements throughout, and wherein the illustrated structures are not necessarily drawn to scale.

The inventors of the present invention appreciate that interconnection of devices, such as transistor devices, within an integrated circuit, also referred to as metallization, is typically accomplished by forming a multi-level interconnect network structure in layers formed over the electrical devices, by which the device active elements are connected to other devices to create the desired circuits. Conductive materials, such as, aluminum, aluminum-silicon alloys, copper, copper alloys, silver, silver alloys and the like, are formed within dielectric layers and are employed to provide relatively low resistance connections between components and devices.

Some conductive materials, such as copper, are not easily etched or patterned. For this reason and others, metallization layers are often formed by depositing a dielectric layer, such as an interlayer dielectric layer (ILD), and etching trench and/or via regions into which conductive material is deposited. Uniform and controlled etching of trench and/or via regions within the dielectric layers is generally required for formation of trenches and/or vias with proper shape, size, and thickness. Subsequently, a planarization process, such as chemical mechanical planarization (CMP), is performed which removes excess conductive material and leaves the conductive material within the trench and/or via regions to serve as lines, interconnects, and the like.

A characteristic that impacts device performance is a dielectric constant value, referred to as k-value, of the dielectric layer(s) employed in damascene or interconnect structures. Generally, higher k-values for dielectric layers in these structures leads to higher capacitance values, which degrade device performance.

One mechanism employed to reduce the k-values for these dielectric layers is to employ low-k dielectric materials. However, these low-k dielectric layers can be relatively porous and undesirably permit materials and chemical species to intercalate into the pores, which create defects, compromise dielectric integrity, and hamper device operation. Intercalated materials and species include, for example, moisture, metal barrier deposition precursors, deposited metal barrier, copper, solvents, plasma chemistries, and the like. The created defects can also degrade lifetime performance of the devices. For example, a device designed to have a 10 year lifetime may be reduced to having a few days lifetime as a result of the undesired migrated materials and defects created thereby.

Another problem of porous, low k-value dielectric materials is that they form irregular sidewall surfaces after features are etched into them. Thus, subsequently formed layers along the sidewall surfaces of the low k dielectric materials have irregular thicknesses or areas with compromised integrity.

The present invention facilitates damascene processing and semiconductor devices by employing a pore sealing liner present on sidewalls and bottoms of trench regions, sidewalls of via regions, but not on bottom surfaces of via regions. As a result, low-k porous dielectric materials can be employed in damascene processing without material, such as moisture, metal barrier precursors, copper, solvents, plasma chemistries, and the like, undesirably migrating into the low-k, porous dielectric layers. Additionally, a low resistance contact from conductive via features to underlying structures is also provided. The partial to full absence of the pore sealing liner on the bottom surfaces of via regions permits the low resistance contact to underlying devices, which previously has been difficult to achieve with pore sealing liners.

FIG. 1A is a cross sectional view of a convention semiconductor device 100 having low-k damascene dielectric layers fabricated with conventional damascene processes. FIG. 1A is provided as an example of a conventional device formed by conventional fabrication processes. FIG. 1A and this description are provided to illustrate deficiencies of the prior art identified by the inventors of the present invention.

The device 100 includes a semiconductor body 101 having a semiconductor substrate and transistors and/or other devices formed therein. The semiconductor body 101 may also include one or more interconnect layers. One such layer is a metal interconnect 102 formed on the semiconductor body 101 and adjacent an insulative layer 104. The metal interconnect 102 is comprised of a conductive material, such as copper or can be a silicide region adjacent, for example, an underlying gate, source, or drain region.

An etch stop layer 106 is formed over the semiconductor body 101 and the metal interconnect 102 and facilitates subsequent etching processes. Typically, the first etch stop layer 106 is chosen to act as a dielectric copper diffusion barrier and to be capable of being selectively etched or selectively preserved with respect to low-k dielectrics. A low-k interlevel dielectric layer 108 is then formed on the first etch stop layer 106 by a suitable deposition process. The interlevel dielectric layer 108 is comprised of a low-k dielectric material and is relatively porous. A low-k inter metal dielectric layer 112 is then formed on the interlevel dielectric layer 108. The inter metal dielectric layer 112 is also comprised of a low-k dielectric material. It is also understood that in manifestations where the interlevel dielectric layer 108 and the intermetal dielectric layer 112 are comprised of the same material, the deposition can be performed in one step with no physical distinction between the two layers.

A trench etch process is performed to form a trench cavity 116 within the inter metal dielectric layer 112. The trench etch process employs a suitable etch chemistry, such as $CF_4$, Ar, and $O_2$, for a duration to selectively remove material from the inter metal dielectric layer 112 to form the trench cavity 116. A photolithographically patterned mask (not shown) is typically employed to define the trench region during the etch process. The mask and techniques to form the mask would be familiar to one of ordinary skill in the art.

A via etch process is then performed to form a via cavity 114 substantially within the inter layer dielectric layer 108. The via etch process also employs a suitable etch chemistry, such as $CF_4$, Ar, and $O_2$, for a duration to selectively remove material from the inter layer dielectric layer 108 to form the via cavity 114. A second mask patterned through photolithographic techniques (not shown) is typically employed to define the via regions during the etch process and would be familiar to one of ordinary skill in the art. The first etch stop layer 106 has a lower etch rate than that of the inter-level dielectric layer 108 during this via etch and, therefore, serves to mitigate over-etching into the underlying metal interconnect 102. An etch stop layer etch is then performed to remove a selected, exposed portion of the first etch stop layer 106 and expose at least a portion of the metal interconnect 102. It is also understood that other manifestations in manufacture are common such as choosing to do the via etch first and follow with a trench etch second, ending with an etch-stop layer etch.

The via cavity 114 and the trench cavity 116 are then lined with the conductive copper diffusion barrier, such as Ta. It is then filled with a conductive material, such as copper. In one example, a copper layer is deposited on the device (e.g., by electrochemical deposition), facilitated by a seed layer, so as to fill the trench cavity 116 and the via cavity 114, followed by a planarization step (e.g., by chemical mechanical planarization).

Figure 1B:
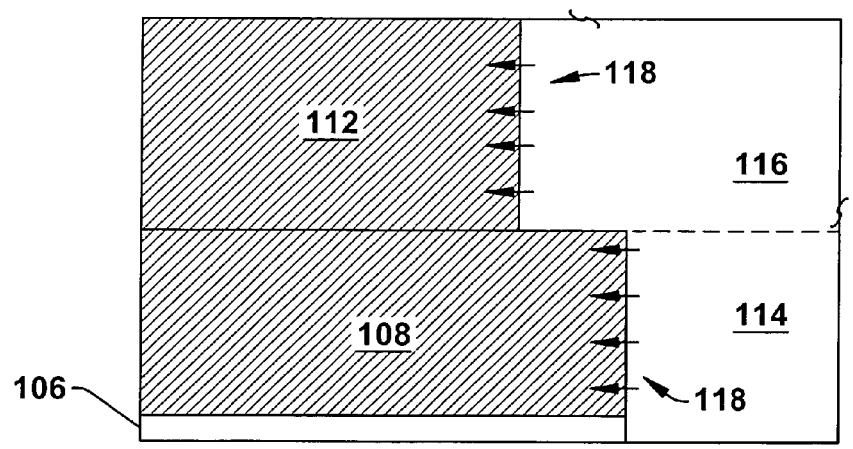
FIG. 1B is another cross sectional view of the device of FIG. 1A.

FIG. 1B is a close up view of a portion of the conventional device 100 of FIG. 1A. FIG. 1B is provided as an example of a conventional device formed by conventional fabrication processes. FIG. 1B and this description are provided to illustrate deficiencies of the prior art identified by the inventors of the present invention.

The inventors of the present invention recognize that the relatively high porosity of the inter-level dielectric layer 108 and the inter-metal dielectric layer 112 permit other materials 118, such as atomic layer deposition (ALD) or chemical vapor deposition (CVD) precursors used for the barrier metal, conductive fill material, solvents, and the like, to undesirably migrate into the layers 108 and 112 via pores within the material. Further, the integrity of the Cu diffusion barrier itself may be compromised due to the porosity and/or excessive sidewall roughness and topography, allowing Cu to diffuse into the low k dielectric. As a result, defects are created that degrade device operation and/or performance. For example, copper infiltration can undesirably create electrical shorts in devices.

Figure 2:
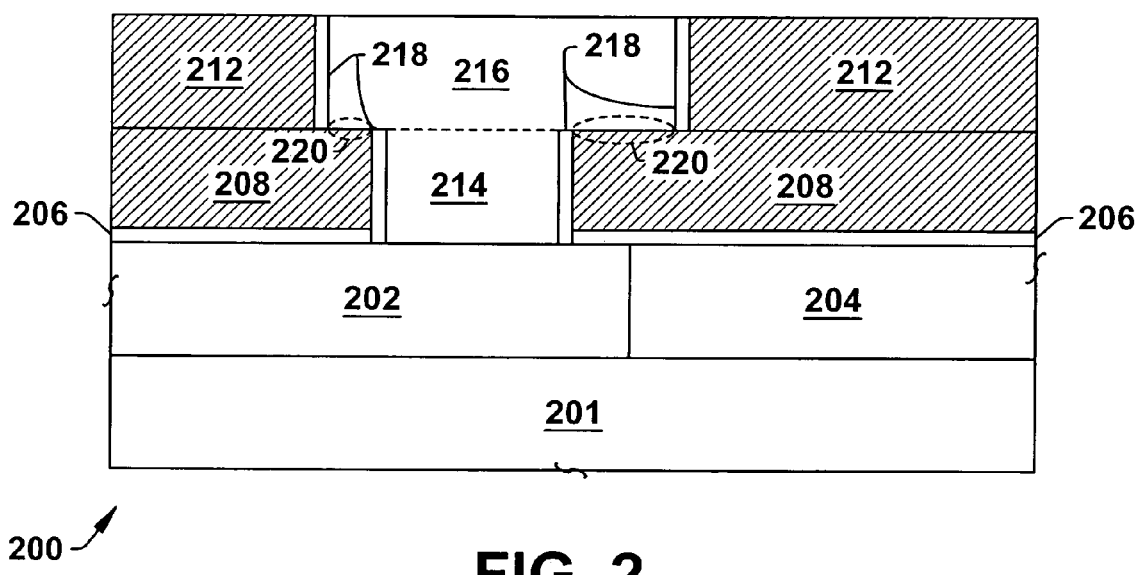
FIG. 2 is a cross sectional view of another semiconductor device fabricated with conventional damascene processes.

FIG. 2 is a cross sectional view of a conventional semiconductor device 200 having low-k damascene dielectric layers fabricated with conventional damascene processes. FIG. 2 is provided as an example of a conventional device formed by conventional fabrication processes. FIG. 2 and this description are provided to illustrate deficiencies of the prior art identified by the inventors of the present invention.

The device 200 employs a partially sealing liner that mitigates some migration of other materials into low-k dielectric layers, but still permits an undesirable amount of conductive material to migrate into the dielectric layers.

The device 200 is substantially similar to the conventional device 100 of FIG. 1A. The device 200 includes a semiconductor body 201 having a semiconductor substrate and transistors and/or other devices formed therein. The semiconductor body 201 may also include one or more interconnect layers. One such layer is a metal interconnect 202 formed on the semiconductor body 201 and adjacent an insulative layer 204. The metal interconnect 202 is comprised of a conductive material, such as copper or can be a silicide region adjacent, for example, an underlying gate, source, or drain region.

Once again, an etch stop layer 206 is formed over the semiconductor body 201 and the metal interconnect 202 and facilitates subsequent etching processes. Typically, the etch stop layer 206 is chosen to act as a dielectric copper diffusion barrier and to be capable of being selectively etched or selectively preserved with respect to low-k dielectrics. A low-k inter-level dielectric layer 208 is then formed on the first etch stop layer 206 by a suitable deposition process. The inter-level dielectric layer 208 is comprised of a low-k dielectric material and is relatively porous. A low-k inter metal dielectric layer 212 is then formed on the low-k inter-level dielectric layer 208. The inter-metal dielectric layer 212 is also comprised of a low-k dielectric material. It is also understood that in manifestations where the inter-level dielectric layer 108 and the inter-metal dielectric layer 112 are comprised of the same material, the deposition can be performed in one step with no physical distinction between the two layers.

A trench etch process is performed to form a trench cavity 216 within the inter-metal dielectric layer 212. The trench etch process employs a suitable etch chemistry, such as $CF_4$, Ar, and $O_2$, for a duration to selectively remove material from the inter-metal dielectric layer 212 to form the trench cavity 216. A photolithographically patterned mask (not shown) is typically employed to define a trench region during the etch process.

A via etch process is then performed to form a via cavity 214 substantially within the inter layer dielectric layer 208. The via etch process also employs a suitable etch chemistry for a duration to selectively remove material from the inter layer dielectric layer 208 to form the via cavity 214. A second photolithographically patterned mask (not shown) is typically employed to define an etch region during the etch process. The etch stop layer 206 has a lower etch rate than that of the inter level dielectric layer 208 and, therefore, serves to mitigate over-etching into the underlying metal interconnect 202. An etch stop layer etch is then performed to remove a selected, exposed portion of the etch stop layer and expose at least a portion of the metal interconnect 202. It is also understood that the via etch process can be performed before or after the trench etch process.

A dielectric liner 218 is formed on sidewalls and bottom surfaces of the trench cavity 216 and,via cavity 214. Generally, the dielectric liner 218 is formed by depositing the liner over the device thereby forming the liner 218 at least on sidewalls and bottom surfaces of the trench and via cavities. Subsequently, an etch process is employed to remove the liner 218 from bottom surfaces of the trench and via cavities.

The dielectric liner 218 is relatively dense and non-porous and can mitigate migration of undesirable species, such as fill material, barrier layer materials, and the like, into the dielectric layers 212 and 208. However, the dielectric liner 218 is insulative and prevents electrical connection with the metal interconnect 202. As a result, an anisotropic etch is performed that removes portions of the dielectric liner 218 from bottom surfaces of the via. Due to the nature of typical etch processes, the liner is also removed at the bottom of the trench at 220. The inventors of the present invention appreciate that this permits subsequent electrical contact with the metal interconnect 202, however the bottom surfaces 220 of the trench cavity 216 are not protected, giving an intercalation path into film 208.

The via cavity 214 and the trench cavity 216 are then lined with conductive Cu diffusion barrier, such as Ta. It is then filled with a conductive material, such as copper. In one example, a copper layer is deposited on the device, facilitated by a seed layer, so as to fill the trench cavity 216 and the via cavity 214.

The inventors of the present invention recognize that the relatively high porosity of the inter level dielectric layer 208 and the inter metal dielectric layer 212 permit other materials, such as ALD precursors, copper, solvents, and the like, to infiltrate or migrate into the layers 208 and 212 by way of pores within the material at the bottom surface 220 in the trench region 216. As a result, device operation and performance can be degraded despite the presence of the dielectric liner 218.

Figure 3:
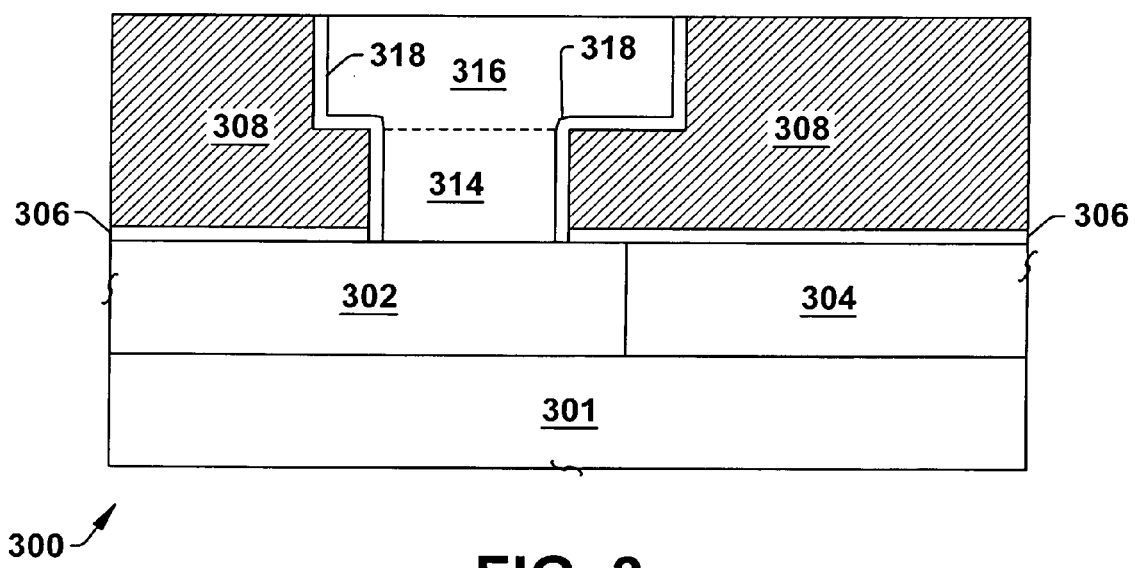
FIG. 3 is a cross sectional view of a semiconductor device having low-k damascene dielectric layers and a pore sealing liner in accordance with an aspect of the present invention.

FIG. 3 is a cross sectional view of a semiconductor device 300 having low-k dielectric layers and a pore sealing liner for dual damascene process formed interconnect layers in accordance with an aspect of the present invention. The device 300 employs a pore sealing liner that substantially prevents or mitigates migration of undesirable materials, such as fill materials, barrier layer materials, and the like, into dielectric layers. The pore sealing liner is located on sidewalls of trench and via regions, bottom surfaces of trench regions, but is not substantially present on bottom surfaces of via regions.

The device 300 includes a semiconductor body 301 having one or more semiconductor layers and including devices, such as transistors, diodes, resistors, and the like formed therein. The semiconductor body 301 may also include one or more interconnect layers. One such layer is a metal interconnect 302 formed on the semiconductor body 301 and adjacent an insulative layer 304. The metal interconnect 302 is comprised of a conductive material, such as copper or can be a silicide region adjacent, for example, an underlying gate, source, or drain region.

An etch stop layer 306 is formed over the semiconductor body 301 and the metal interconnect 302 and facilitates subsequent etching processes. Typically, the etch stop layer 306 is chosen to act as a dielectric copper diffusion barrier and to be capable of being selectively etched or selectively preserved with respect to low-k dielectrics. A low-k dielectric layer 308 is formed on the etch stop layer 306 and is comprised of a low-k dielectric material, such as a dielectric material having a dielectric constant less than about 4, and is relatively porous. Some examples of suitable dielectric materials include silicon dioxide, fluorine-doped silicate glass (FSG), organo-silicate glass (OSG), silsesquioxane (SSQ)-based materials, e.g., MSQ (methylsilsesquioxane) or hydrogensilsesquioxane (HSQ), and the like versions of these materials with varying levels of porosity (with k between 1 and 4). The dielectric layer 308 can be comprised of one or more individual dielectric layers with identical or varied compositions and porosity values. It is noted that aspects of the present invention are not limited to a particular integration scheme and, for example, includes single and dual-damascene integration schemes.

A via feature 314 is formed within the dielectric layer 308 and on/over the metal interconnect 302. A trench feature 316 is formed within the dielectric layer 308 and is typically formed over/on the via feature 314. In an exemplary aspect of the present invention, the etch stop layer 306 can now be selectively etched away from the bottom of the via in order to permit subsequent electrical connection between the via feature 314 and the underlying interconnect 302.

A pore sealing liner 318 is formed along sidewalls and bottom surfaces of the trench feature 316 and along sidewalls of the via feature 314. The liner 318 is comprised of a dielectric material, such as silicon dioxide, silicon nitride, boron carbo-nitride and the like. The pore sealing liner is relatively dense and non-porous, unlike the low-k dielectric layer. The pore sealing liner 318 mitigates unwanted diffusion of other materials, such as copper, precursor materials, solvents, and the like, into the dielectric layer 308. Additionally, the pore sealing liner 318 forms sidewall surfaces that are more uniform than those of the porous dielectric layer 308. As a result, layers formed along the sidewalls (not shown), such as metal barrier layers, can be formed with relatively uniform thicknesses and can be formed with uncompromised integrity.

The pore sealing liner 318 can be formed by one or more suitable fabrication processes such as spin-on deposition, ALD based deposition, or PECVD (plasma enhanced chemical vapor deposition). In one example, via and trench cavities are formed within the low-k dielectric layer 308. Then, a relatively dense dielectric material is deposited over the device followed by a selective anisotropic etch process that removes the deposited dense dielectric material from at least a portion of a bottom surface of the via cavity while substantially leaving the liner 318 on sidewalls of the via cavity and sidewall and bottom surfaces of the trench cavity as well as on the field areas of the wafer (between trenches). It is appreciated that, in some embodiments, the pore-sealing liner can be removed with additional processing from the field areas of the wafer (while retaining the liner on the trench and via sidewalls, and on trench bottom). In another example, a dense dielectric material is deposited over the device 300 followed by a selective etch-deposition process that removes the deposited dense dielectric material from at least a portion of the bottom surface of the via cavity while substantially leaving the liner 318 on sidewalls of the via cavity and sidewall and bottom surfaces of the trench cavity, as well as on the field areas of the wafer (between trenches). It is appreciated that, in some aspects, the pore-sealing liner can be removed with additional processing from the field areas of the wafer (while retaining the liner on the trench and via sidewalls, and on trench bottom). In one example, this invention utilizes a PVD barrier deposition chamber where the flux of neutral barrier (say Ta) atoms added to the flux of ionized barrier (say Ta) atoms is matched to (or is slightly greater than) the etched flux of Ta atoms at the bottom of the trench but is less than the etched flux of atoms away from the wafer (Ta and lighter elements like Si, N, O, etc) at the bottom of the via. The etching flux of atoms from various points of the wafer surface is aided by the use of ionized Ar atoms that are generated in the plasma above the wafer. The net removal of atoms from the wafer diminishes from the 'field' area (where there is net deposition), to the bottom of the trench (where it can be adjusted so that a substantial portion of the liner remains intact), and further to the bottom of the via (where there is net removal). This is because the neutral barrier metal atoms do not have the necessary perpendicular velocity vector that will allow them to reach the via bottom. Ionized barrier atoms are accelerated by the electric field established between the wafer and the plasma, resulting in more perpendicular velocity vectors, which allows them to reach the via bottom. Since the ratio of neutrals and ionized barrier atoms can be tuned (the relative amount of neutral atoms increases as the target bias is reduced), the desired variation on net etch rates at field, trench bottom and via bottom can be achieved. Additionally, by changing the strength of the field adjacent to the wafer, the perpendicularity of the ionized atom (Ar and Ta) velocity can be increased—which permits additional tuning of the relative etch amounts. This is how this invention accomplishes the selective removal of the liner at the bottom of the via, while protecting the liner at the trench bottom and along the sidewalls. It also protects the liner from the top surface of the wafer.

The reliability and operation of the device 300 are facilitated by employing the pore sealing liner 318 as described above. As a result, expected and/or desired device lifetimes can be obtained and expected and/or desired operation performance can be obtained due to the mitigation of undesired or unwanted other materials into the dielectric layer 308 and by forming more uniform sidewall surfaces.

It is noted that the present invention is not limited to the structures shown and described with respect to the device 300 of FIG. 3. Other suitable damascene structures that employ a pore sealing liner, which is at least partially removed from a bottom surface of a via region, are contemplated and in accordance with the present invention. For example, an additional trench etch stop layer can be employed or the etch stop layer 306 can be omitted. It is noted that aspects of the present invention are not limited to a particular integration scheme and, for example, includes single and dual-damascene integration schemes.

Figure 4:
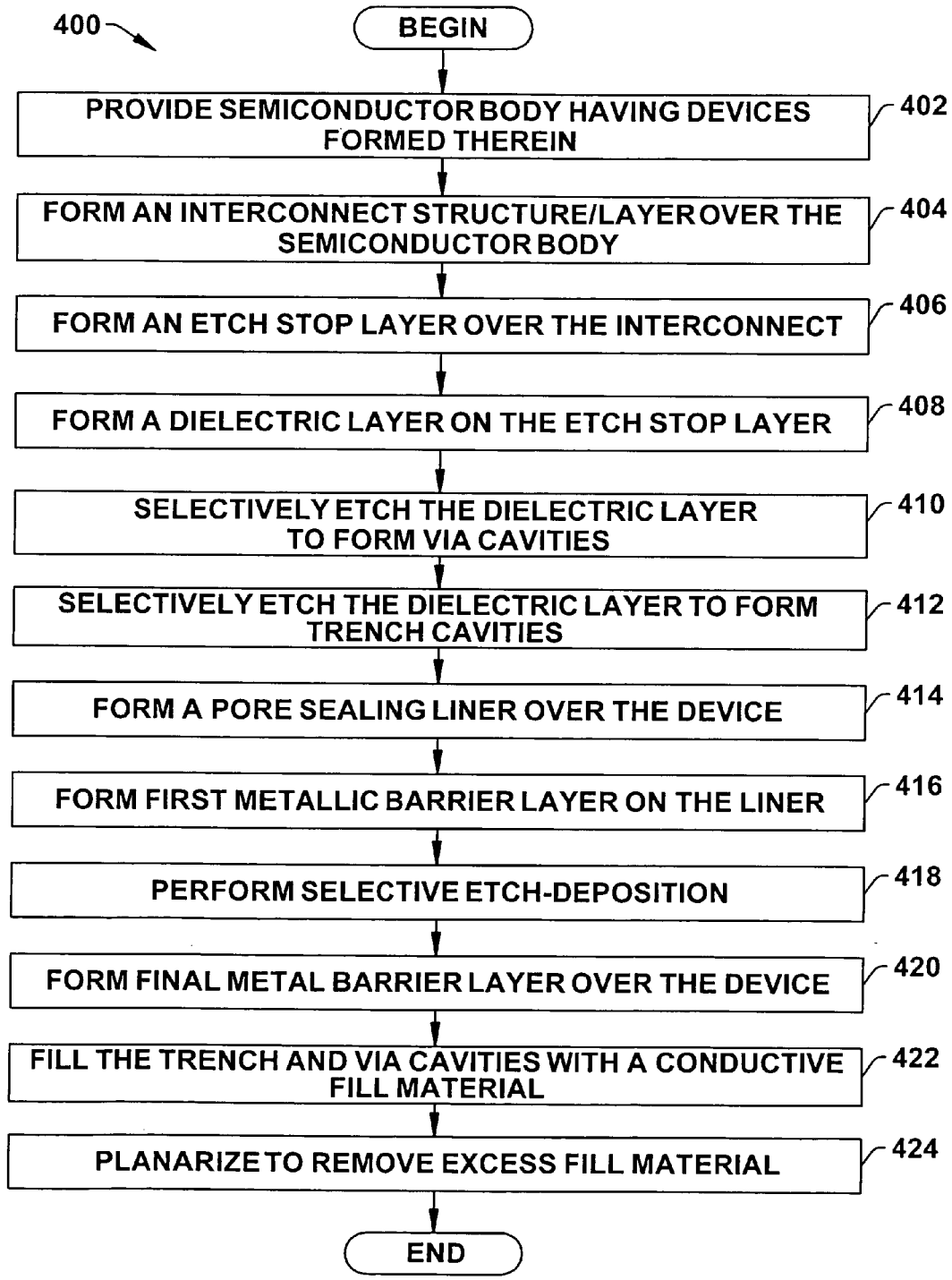
FIG. 4 is a flow diagram illustrating a method of fabricating a semiconductor device with a selectively formed pore sealing liner in accordance with an aspect of the present invention.

FIG. 4 is a flow diagram illustrating a method 400 of fabricating a semiconductor device with a selectively formed pore sealing liner within a dual damascene structure in accordance with an aspect of the present invention.

The method 400 begins at block 402 wherein a semiconductor body is provided. The semiconductor body comprises one or more semiconductor layers and devices, such as transistors, resistors, diodes, interconnect layers, and the like. An interconnect layer is formed over the semiconductor body at block 404. The interconnect layer comprises a metal interconnect or a silicide region or contact.

An etch stop layer is formed on the interconnect layer at block 406 by depositing a material is chosen to act as a dielectric copper diffusion barrier and to be capable of being selectively etched or selectively preserved with respect to low-k dielectrics that differs from subsequently formed dielectric layers. The etch stop layer facilitates later etch processes by mitigating over and/or under etching. As an example, a suitable etch stop layer is comprised of silicon nitride or silicon carbo-nitride or silicon carbo-oxy-nitride.

A low k dielectric layer, such as an inter-level dielectric layer, is formed over the interconnect layer at block 408. The dielectric layer is formed by depositing one or more low-k dielectric materials having a dielectric constant less than about 4.0, and typically less than about 2.9. One or more deposition processes can be employed. As a result, the dielectric layer can be comprised of one or more individual dielectric layers that are comprised of the same or varied dielectric materials, including those with varied dielectric constants.

The dielectric layer is comprised of a suitable dielectric material, such as silicon dioxide, fluorine-doped silicate glass (FSG), organo-silicate glass (OSG), silsesquioxane (SSQ)-based materials, e.g., MSQ (methylsilsesquioxane) or hydrogensilsesquioxane (HSQ), and the like. A thickness of the dielectric layer can vary according to the device being fabricated, however some examples of suitable thicknesses for the dielectric layer are about 500 to about 10,000 Angstroms.

A via etch is then performed at block 410 on the dielectric layer to form via cavities. A photolithographically patterned mask is generally employed to define or select target via regions for etching. The via etch is performed with any suitable etch chemistry so as to remove an exposed portion of the dielectric layer thereby forming via cavities. Some exemplary thicknesses or depths of the via cavities include about 500 to 10,000 Angstroms, however other thicknesses are contemplated in accordance with the present invention.

A trench etch is performed at block 412 on the dielectric layer to form trench cavities. A second photolithographically patterned mask is typically employed to define or select target trench regions for etching. The trench etch is performed with an etch chemistry so as to remove exposed portions of the dielectric layer thereby forming trench cavities. Some exemplary thicknesses or depths of the trench cavities include about 500 to about 10,000 Angstroms, however other thicknesses are contemplated in accordance with the present invention.

Sidewall and bottom surfaces of the trench and via cavities can be relatively non-uniform, irregular, and porous as a result of the low-k, porous dielectric materials employed.

A pore sealing liner is formed over the device and on sidewall and bottom surfaces of the trench and the via cavities at block 414. The pore sealing liner is comprised of a relatively dense material that mitigates diffusion and/or migration of subsequently formed layers and/or exposed chemistries into the dielectric layers. Some examples of suitable materials for the pore sealing liner are silicon dioxide, silicon nitride, silicon carbide, silicon carbo-nitride, silicon oxy-nitride, dense organo-silicate glass (OSG), organic polymers, and the like. The pore sealing liner is formed with a thickness sufficient to mitigate subsequent diffusion and/or migration, such as, for example, a thickness of 0.5 to 15 nanometers and has a k-value typically >2.7.

A first metallic barrier layer is formed on the pore sealing liner at block 416. The first metallic Cu diffusion barrier layer protects the via and cavity surfaces during conductive material fill processes, such as described below. The thickness of first metallic barrier layer has a suitable thickness, such as, for example, 0.5 to 15 nanometers. The first metallic barrier layer is comprised of a conductive material, such as, for example, Ta—, W—, Ti-based materials, including their nitrides, carbo-nitrides and silicon nitrides, Ru, and Ir, and oxides of Ru and Ir. Some additional suitable materials include, for example, PVD Ta, and ALD-TaN. It is noted that alternate aspects of the invention include omitting the first metallic barrier layer.

A selective etch-deposition process is performed at block 418 that selectively removes at least a portion of the pore sealing liner and can remove at least a portion of the first barrier layer from bottom surfaces of the via cavities while forming/depositing a second metal barrier layer on the sidewall surfaces of the via cavities and the sidewall and bottom surfaces of the trench cavities. As a result, the protective liner remains on the sidewall surfaces of the via cavities and on the sidewall and bottom surfaces of the trench cavity and the protective liner can mitigate or prevent subsequent diffusion or migration of conductive materials.

In one exemplary suitable selective etch-deposition process, an etch rate at a center of the bottom surfaces is faster than at edges of the bottom surfaces of the via cavities. As a result, potential unlanded vias (misaligned) can be protected, although an increase in average via resistance for fully landed vias (properly aligned) may occur. The varied etch rates at the bottom surfaces can be selected according to expected or percentage of allowable misalignment.

It is appreciated that, in some aspects of the invention, the pore-sealing liner can be removed with additional processing from the field areas of the wafer (while retaining the liner on the trench and via sidewalls, and on trench bottom). In the case where no sacrificial dense dielectric is used, the liner should be left unetched on the field areas as well (where no trench or via is present). In one example, this invention utilizes a PVD barrier deposition chamber where the flux of neutral barrier (say Ta) atoms added to the flux of ionized barrier (say Ta) atoms is matched to (or is slightly greater than) the etching flux of Ta atoms at the bottom of the trench but is less than the etching flux of atoms away from the wafer (Ta and lighter elements like Si, N, O, etc) at the bottom of the via. The etching flux of atoms from various points of the wafer surface is aided by the use of ionized Ar atoms that are generated in the plasma above the wafer. The net removal of atoms from the wafer diminishes from the 'field' area (where there is net deposition), to the bottom of the trench (where it can be adjusted to be zero or slightly on the net deposition side), and further to the bottom of the via (where there is net removal). This is because the neutral barrier metal atoms do not have the necessary perpendicular velocity vector that will allow them to reach the via bottom. Ionized barrier atoms are accelerated by the electric field established between the wafer and the plasma, resulting in more perpendicular velocity vectors, which allows them to reach the via bottom. Since the ratio of neutrals and ionized barrier atoms can be tuned (the relative amount of neutral atoms increases as the target bias is reduced), the desired variation on net etch rates at field, trench bottom and via bottom can be achieved. Additionally, by changing the strength of the field adjacent to the wafer, the perpendicularity of the ionized atom (Ar and Ta) velocity can be increased—which permits additional tuning of the relative etch amounts. This is how this invention accomplishes the selective removal of the liner at the bottom of the via, while protecting the liner at the trench bottom and along the sidewalls. It also protects the liner from the top surface of the wafer.

Conventional anisotropic etch processes remove line-of sight material, such as material on horizontal surfaces, but do not significantly remove material from the sidewalls. Thus, with the conventional etch processes, both the trench and via bottoms would be recessed. The selective etch-deposition process avoids etching of the horizontal surface, the bottom surfaces, of the trench cavities. An example of a suitable selective etch-deposition process is accomplished by placing the wafer in a process chamber of a PVD tool and using a specially tuned re-sputter etch with an intermediate DC target power (between 1 kW and 10 kW in a 200 mm system) to create the aforementioned desired mix of ionized and neutral atoms in the flux of barrier metal directed toward the wafer. This is utilized along with a flow of a gas like Argon (between 20 sccm and 100 sccm), and RF energy applied to the wafer (between 100 W and 500 W in a 200 mm system) in order to accelerate the barrier metal ions and the inert-gas atoms. These conditions balance the etch at the trench bottom surfaces, but are not adequate to balance the etch at the via bottom surfaces. That is, the flux between deposition and etch components at the trench bottom is matched given little net deposition or removal of material. However, the flux at the via bottom is higher for etch components than deposition components. This gives a net etching of the first barrier layer and pore sealing liner at the via bottom while maintaining the thickness at the trench bottom.

A final metal barrier layer is then formed over the device at block 420. The final metal barrier layer is optional and is typically formed in order to cover misaligned via cavities. The final metal barrier layer can be formed by a PVD or ALD deposition process and is comprised of a conductive material, such as the ones described above with respect to the first metal barrier layer. Some examples of suitable materials for the barrier layer include, but are not limited to, tantalum, tantalum nitride, tantalum silicon nitride, titanium nitride, titanium silicon nitride, tungsten, tungsten nitride, tungsten silicon nitride, or contain ruthenium, iridium, or other binary or ternary compounds. In the case of physical vapor deposition for example, the deposition of the barrier layer is typically performed in an environment where the pressure is between about 0.5 and 50 mTorr, and a temperature between about 0 and 200 degrees Celsius to a thickness between about 10 and 500 angstroms. It is noted that alternate aspects of the present invention include omitting forming the final metal barrier layer. It is also noted that the barrier materials can be different in each of the steps.

The trench and via cavities are filled with a conductive material at block 422 to form conductive trench and via features or structures.

A number of suitable processes can be employed to fill the cavities with conductive material. In one example, a seed layer is optionally formed on the final barrier layer, if present, or sidewalls and bottom surfaces of the cavities by depositing a relatively thin layer of conductive material (e.g., copper). The seed layer provides nucleation sites for subsequent deposition of copper and/or copper containing material. Thereafter, copper is formed on the seed layer at using a suitable copper deposition process. Some examples of suitable deposition mechanisms include electrochemical deposition (ECD), electroless deposition (e-less dep), chemical vapor deposition (CVD), and physical vapor deposition (PVD).

The presence of the pore sealing liner mitigates or prevents materials and chemicals employed in forming the final metal barrier layer at block 420 and filling the trench and via cavities with conductive materials from migrating or infiltrating the low k dielectric layer. For example, materials, such as ALD precursors, fill material (copper), chemical solvents, and the like, can be prevented from infiltrating the low k dielectric layer.

A planarization process is performed at block 424 to remove excess conductive material and electrically isolate conductive features formed in the trench and via regions. Additional metallization layers and/or packaging can subsequently be performed to complete fabrication of the semiconductor device.

It is appreciated that variations in the method 400 are contemplated in accordance with the present invention. For example, resist masks can be employed to alter only portions of the dielectric layers. Additionally, etch stop layers can also be employed to further facilitate etching of the dielectric layers and formation of the cavities.

While, for purposes of simplicity of explanation, the method 400 is depicted as executing serially. It is to be understood and appreciated that the present invention is not limited by the illustrated order, as some aspects could, in accordance with the present invention, occur in different orders and/or concurrently with other aspects from that depicted and described herein. Moreover, not all illustrated features may be required to implement a methodology in accordance with an aspect the present invention.

FIGS. 5A to 5E depict stages of fabrication for an exemplary semiconductor device formed in accordance with the method 400 of FIG. 4. The FIGS. 5A to 5E are exemplary in nature and are provide to facilitate understanding of the present invention and the method 400 of FIG. 4. It is appreciated that variations in structure, composition, dimensions, and the like for the device can occur and still be in accordance with the present invention.

Figure 5A:
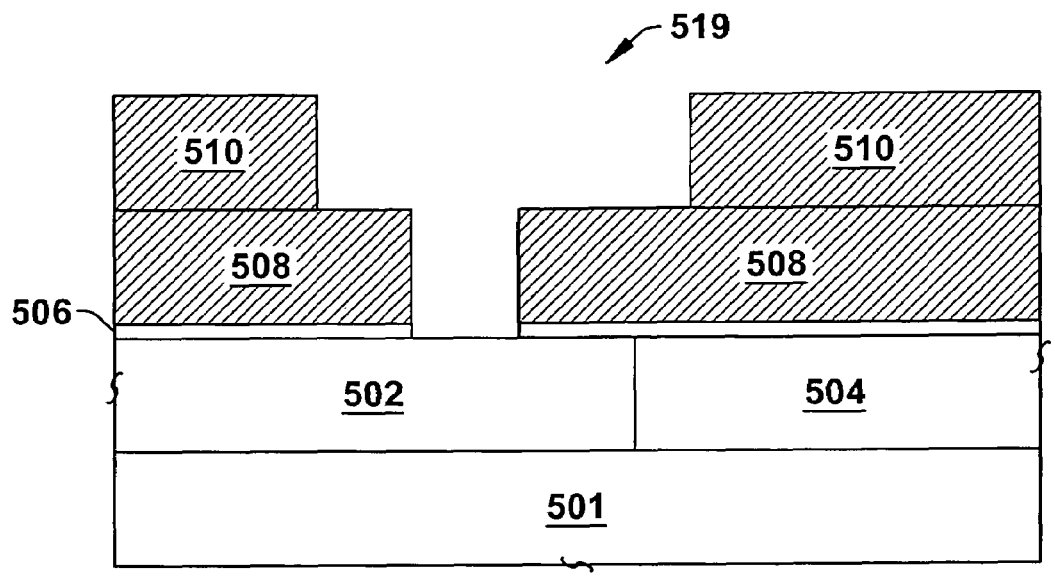
FIGS. 5A to 5E depict stages of fabrication for an exemplary semiconductor device formed in accordance with the method of FIG. 4.

FIG. 5A depicts a semiconductor device 500 at a stage of fabrication in accordance with an aspect of the present invention. A semiconductor body 501 is shown that comprises one or more layers of semiconductor materials and devices, such as transistors, diodes, and the like. An interconnect layer is depicted as formed on the semiconductor body 501. The interconnect layer comprises a metal interconnect 502 and an insulative portion 504. An etch stop layer 506 is formed to facilitate a subsequent via etch process. The etch stop layer 506 is comprised of a material that has a relatively low etch rate. It is noted that the method 400 and the present invention do not require the etch stop layer 506 and that a device can be fabricated in accordance with the present invention without an etch stop layer.

A dielectric layer, which is comprised of a lower dielectric layer 508 and an upper dielectric layer 510, is formed on the etch stop layer 506. The lower dielectric layer 508 is comprised of a suitable dielectric material, which is typically a porous, low-k dielectric material. Some examples of suitable materials include silicon dioxide, fluorine-doped silicate glass (FSG), organo-silicate glass (OSG), silsesquioxane (SSQ)-based materials, e.g., MSQ (methylsilsesquioxane) or hydrogensilsesquioxane (HSQ), and the like. The upper dielectric layer 510 is also comprised of a suitable dielectric material, which is typically a porous, low-k dielectric material. However, it is noted that alternate aspects of the present invention contemplate dielectric layers with varied dielectric constants and porosity. For example, the upper dielectric layer 510 can, as an example, be comprised of a higher k-value, non porous material.

Via and trench cavities 519 are formed within the dielectric layer 508 and 510 by a suitable etch process. In this example, the via cavity is formed within the first dielectric layer 508 and the trench cavity is formed within the second dielectric layer 510.

Figure 5B:
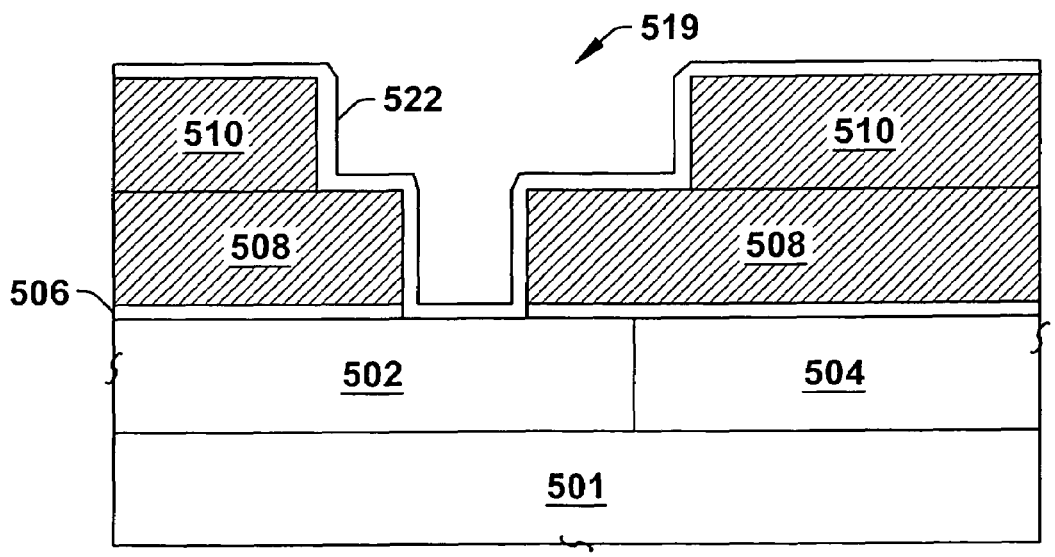

A pore sealing liner 522 is formed over the device 500 and, in particular, on sidewall and bottom surfaces of the trench cavity and the via cavity 519 as shown in FIG. 5B. The pore sealing liner is comprised of a relatively dense material that mitigates diffusion and/or migration of subsequently formed layers into the dielectric layer 508 and 510. In the device 500, the pore sealing liner is insulative, but may not be so in alternate aspects of the invention. Some examples of suitable materials for the pore sealing liner 522 are silicon dioxide, silicon nitride, silicon carbide, dense organo-silicate glass (OSG), and the like. The pore sealing liner 522 has a thickness sufficient to mitigate subsequent diffusion and/or migration, such as, for example, 0.5 to 15 nanometers. Additionally, an initial or first metal barrier layer (not shown) may be formed on the pore sealing liner 522 at this point.

Figure 5C:
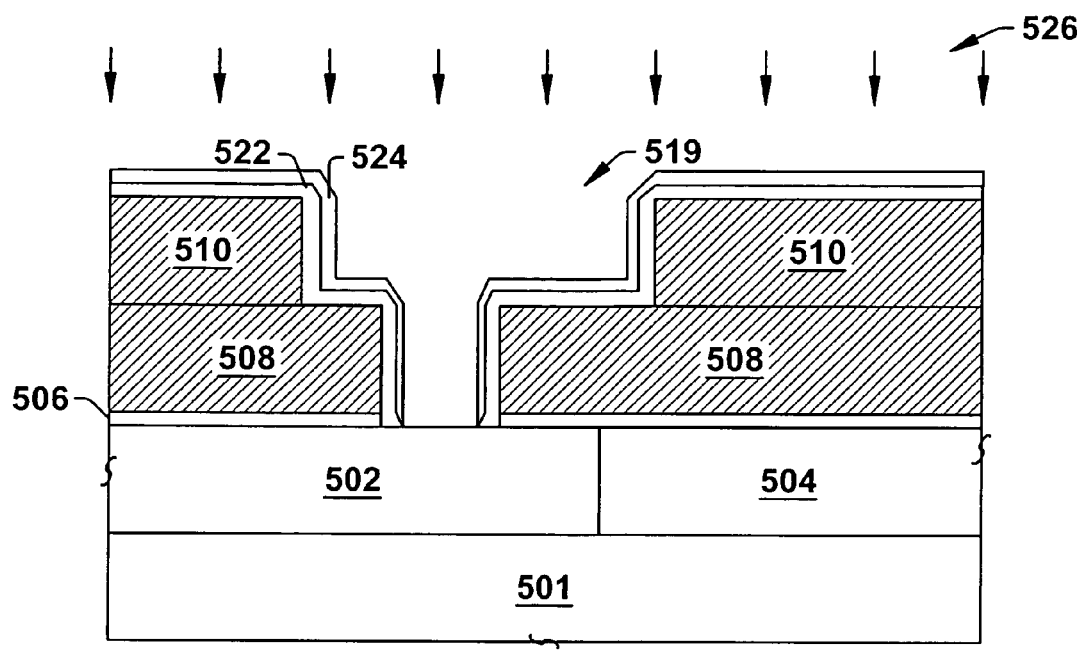

FIG. 5C depicts the semiconductor device 500 at another stage of fabrication in accordance with an aspect of the present invention. A metallic barrier layer 524 is formed on the pore sealing liner 522 and on the bottom surface of the via cavity while the pore sealing liner 522 is removed from a bottom portion of the via cavity. The metallic barrier layer protects the via and cavity surfaces during conductive material fill processes, such as described below. The thickness of first metallic barrier layer has a suitable thickness, such as, for example, 0.5 to 15 nano-meters. The first metallic barrier layer is comprised of a conductive material, such as, for example, Ta—, W—, Ti-based materials, including their nitrides, carbo-nitrides and silicon nitrides, Ru, and Ir, and oxides of Ru and Ir. Some additional suitable materials include, for example, PVD Ta, and ALD-TaN.

A selective etch-deposition process 526 can be employed to form the metallic barrier layer 524 and remove the selected portion of the pore sealing liner 522. As a consequence, the pore sealing liner remains on the sidewall surfaces of the via cavities and on the sidewall and bottom surfaces of the trench cavity and the pore sealing liner can mitigate or prevent subsequent diffusion or migration of conductive materials.

Figure 5D:
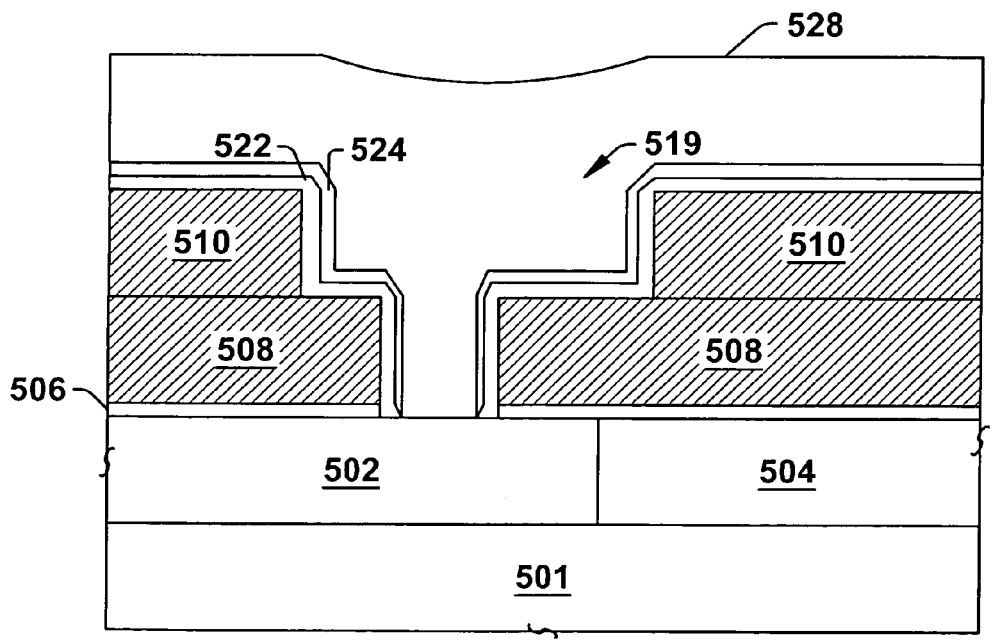

The trench and via cavities 519 are filled with a conductive material 528 as illustrated in FIG. 5D. Substantial conductive fill material, such as copper, is deposited to sufficiently fill the trench and via cavities 519. One or more additional barrier layers (not shown) can be formed on sidewalls and surfaces of the trench and via cavities 519 prior to depositing the conductive fill material. A suitable deposition or formation process for the conductive material is then employed to deposit or form the fill material to completely fill the trench and via cavities 519. Some examples of suitable deposition mechanisms include electrochemical deposition (ECD), electroless deposition (e-less dep), chemical vapor deposition (CVD), and physical vapor deposition (PVD).

Figure 5E:
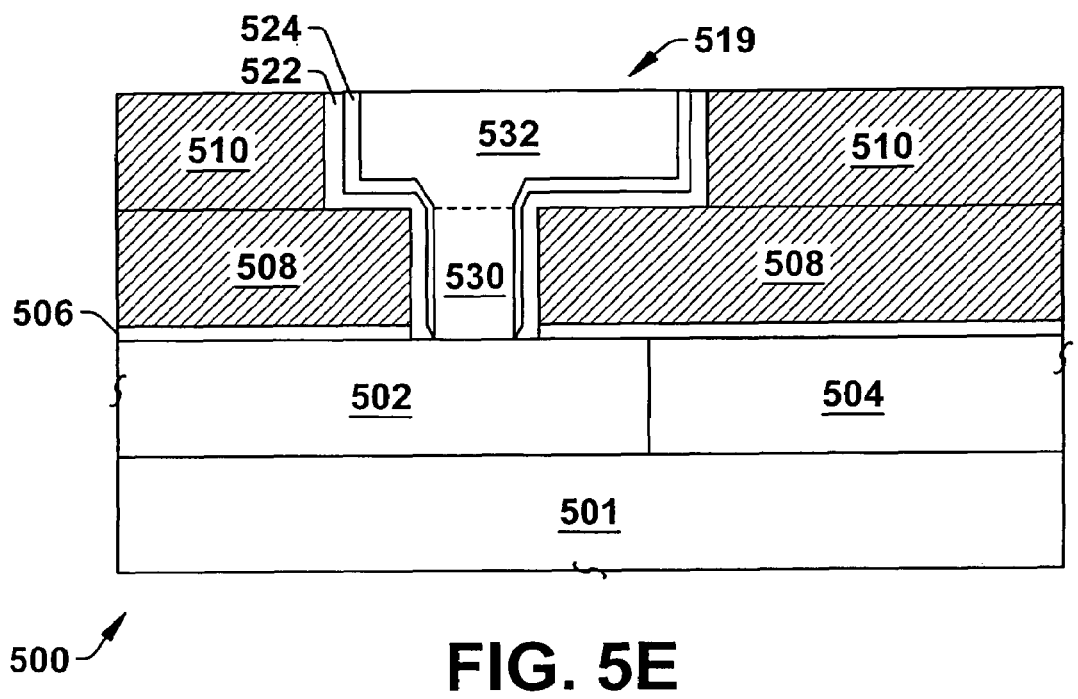

FIG. 5E depicts the semiconductor device 500 at yet another stage of fabrication in accordance with an aspect of the present invention. In order to sufficiently fill the trench and via cavities 519, excess conductive fill material remains on an upper surface of the second dielectric layer and above the trench and via cavities. A planarization process is performed to remove the excess conductive material and define a conductive trench structure or feature 532 and a conductive via region, structure or feature 530. The planarization process also electrically isolates the trench region 532 and the via feature 530 from other conductive features (not shown). Additional metallization layers and/or packaging can subsequently be performed to complete fabrication of the semiconductor device 500.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method of fabricating a semiconductor device comprising:
   forming a dielectric layer over a semiconductor body;
   forming a via cavity within the dielectric layer;
   forming a trench cavity within the dielectric layer;
   forming a pore sealing liner on bottom and sidewall surfaces of the trench cavity and the via cavity; and
   performing a selective etch-deposition process that forms a metal barrier layer on sidewall surfaces of the via cavity and on sidewall and bottom surfaces of the trench cavity and that removes the pore sealing liner from at least a portion of the bottom surface of the via cavity without substantially removing the pore sealing liner from the bottom surface of the trench cavity.

2. The method of claim 1, wherein forming the dielectric layer comprises depositing a porous, low-k dielectric material over the semiconductor body.

3. The method of claim 1, further comprising forming a second metal barrier layer on the pore sealing liner prior to performing the selective etch-deposition process.

4. The method of claim 3, wherein forming the second metal barrier layer comprises depositing a conductive material by physical vapor deposition.

5. The method of claim 3, wherein forming the second metal barrier layer comprises depositing a conductive material by atomic layer deposition.

6. The method of claim 1, further comprising forming a final metal barrier layer after performing the selective etch-deposition process and filling the via cavity and the trench cavity with a conductive fill material and planarizing a surface of the device to remove excess fill material.

7. The method of claim 1, wherein performing the selective etch-deposition process has an etch rate that exceeds a deposition rate at the bottom surface of the via cavity.

8. The method of claim 1, wherein performing the selective etch-deposition process has an etch rate at the center of the via cavity bottom surface greater than a etch rate near the edge of the via cavity bottom surface.

9. The method of claim 8, further comprising selecting the via-center etch rate and the via-edge etch rate according to allowable misalignment between the via and underlying metal structure.

10. A method of fabricating a semiconductor device comprising:
 forming a metal interconnect layer having a metal interconnect over a semiconductor body;
 forming a low-k dielectric layer on the metal interconnect layer;
 forming a via cavity within the dielectric layer;
 forming a trench cavity within the dielectric layer;
 forming a pore sealing liner on bottom and sidewall surfaces of the trench cavity and the via cavity;
 forming a first metal layer comprised of a metal material on the pore sealing liner, wherein the pore sealing liner mitigates migration of the metal material into the first and second dielectric layers;
 performing a selective etch-deposition process that etches the pore sealing liner from the bottom surface of the via cavity and deposits a second metal barrier layer over sidewall surfaces of the via cavity and over sidewall and bottom surfaces of the trench cavity; and
 forming a conductive via feature within the via cavity and on the metal interconnect and forming a conductive trench feature within the trench cavity.

11. The method of claim 10, wherein forming the first dielectric layer comprises depositing an ultra-low k dielectric material.

12. The method of claim 10, wherein the selective-etch deposition process has a higher etch rate than deposition rate at the bottom surface of the via cavity.

13. The method of claim 10, wherein forming the first metal barrier layer comprises depositing the metal material by an atomic layer deposition or a chemical vapor deposition process.

14. The method of claim 10, wherein forming the first metal barrier layer comprises depositing the metal material by a physical vapor deposition process.

* * * * *